United States Patent
Schauer

(10) Patent No.: US 6,978,344 B2
(45) Date of Patent: Dec. 20, 2005

(54) SHIFT REGISTER CONTROL OF A CIRCULAR ELASTICITY BUFFER

(75) Inventor: Steven Alnor Schauer, Loveland, CO (US)

(73) Assignee: LSI Logic Corporation, Milpitas, CA (US)

( * ) Notice: Subject to any disclaimer, the term of this patent is extended or adjusted under 35 U.S.C. 154(b) by 349 days.

(21) Appl. No.: 10/323,104

(22) Filed: Dec. 18, 2002

(65) Prior Publication Data

US 2004/0120189 A1 Jun. 24, 2004

(51) Int. Cl.[7] .......................................... G06F 12/00
(52) U.S. Cl. .................... 711/110; 711/100; 711/109; 710/52; 710/53; 710/54; 710/56
(58) Field of Search .................. 711/100, 109, 110; 710/52, 53, 54, 56

(56) References Cited

U.S. PATENT DOCUMENTS

| | | | | |
|---|---|---|---|---|
| 5,323,426 A | * | 6/1994 | James et al. | 375/372 |
| 5,771,356 A | * | 6/1998 | Leger et al. | 709/233 |
| 6,044,416 A | * | 3/2000 | Hasan | 710/52 |
| 6,408,349 B1 | * | 6/2002 | Castellano | 710/56 |
| 6,529,971 B1 | * | 3/2003 | Thiesfeld | 710/53 |
| 6,696,854 B2 | * | 2/2004 | Momtaz et al. | 326/37 |
| 2002/0174273 A1 | * | 11/2002 | Castellano | 710/29 |

* cited by examiner

Primary Examiner—Donald Sparks
Assistant Examiner—Ngoc Dinh
(74) Attorney, Agent, or Firm—Yee & Associates, P.C.

(57) ABSTRACT

A shift register is provided to monitor the difference between the read and write pulses to an elasticity buffer. The shift register essentially eliminates the need for any math functions in the elasticity buffer management logic. The shift register is as wide as the elasticity buffer is deep. In other words, for every word in the elasticity buffer, the shift register has a corresponding bit. Each time a word is written into the elasticity buffer without a simultaneous corresponding read, a value of "1" is shifted from a first end into the shift register, indicating that a space has been taken in the elasticity buffer. For every word read out of the elasticity buffer without a simultaneous corresponding write, a value of "0" (zero) is shifted from a second end of the shift register, indicating that one more space is available. The elasticity buffer management logic need only monitor the shift register value to determine whether the elasticity buffer is nearly empty or nearly full, and if fill words need to be inserted or deleted.

20 Claims, 4 Drawing Sheets

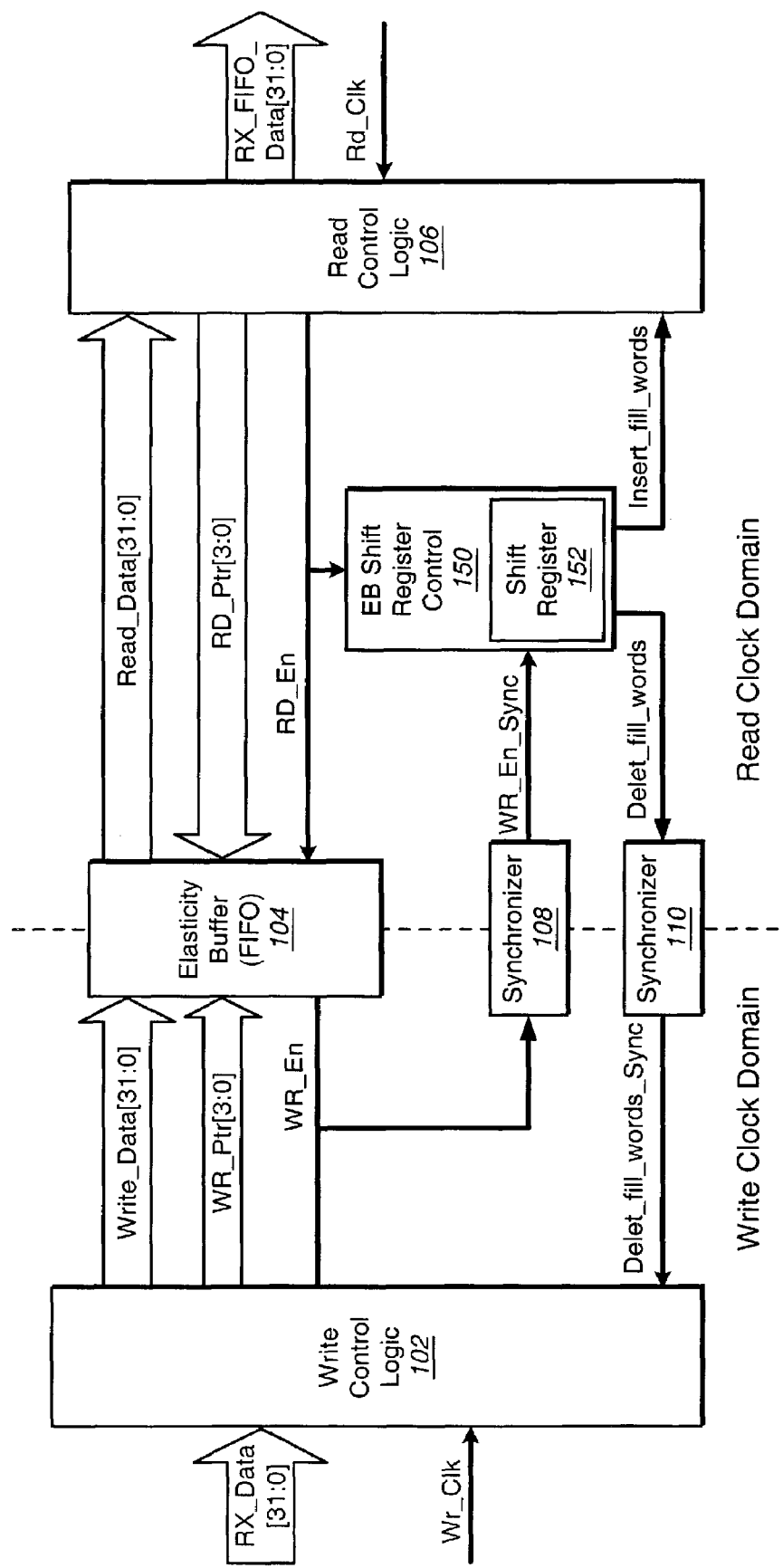
FIG._1

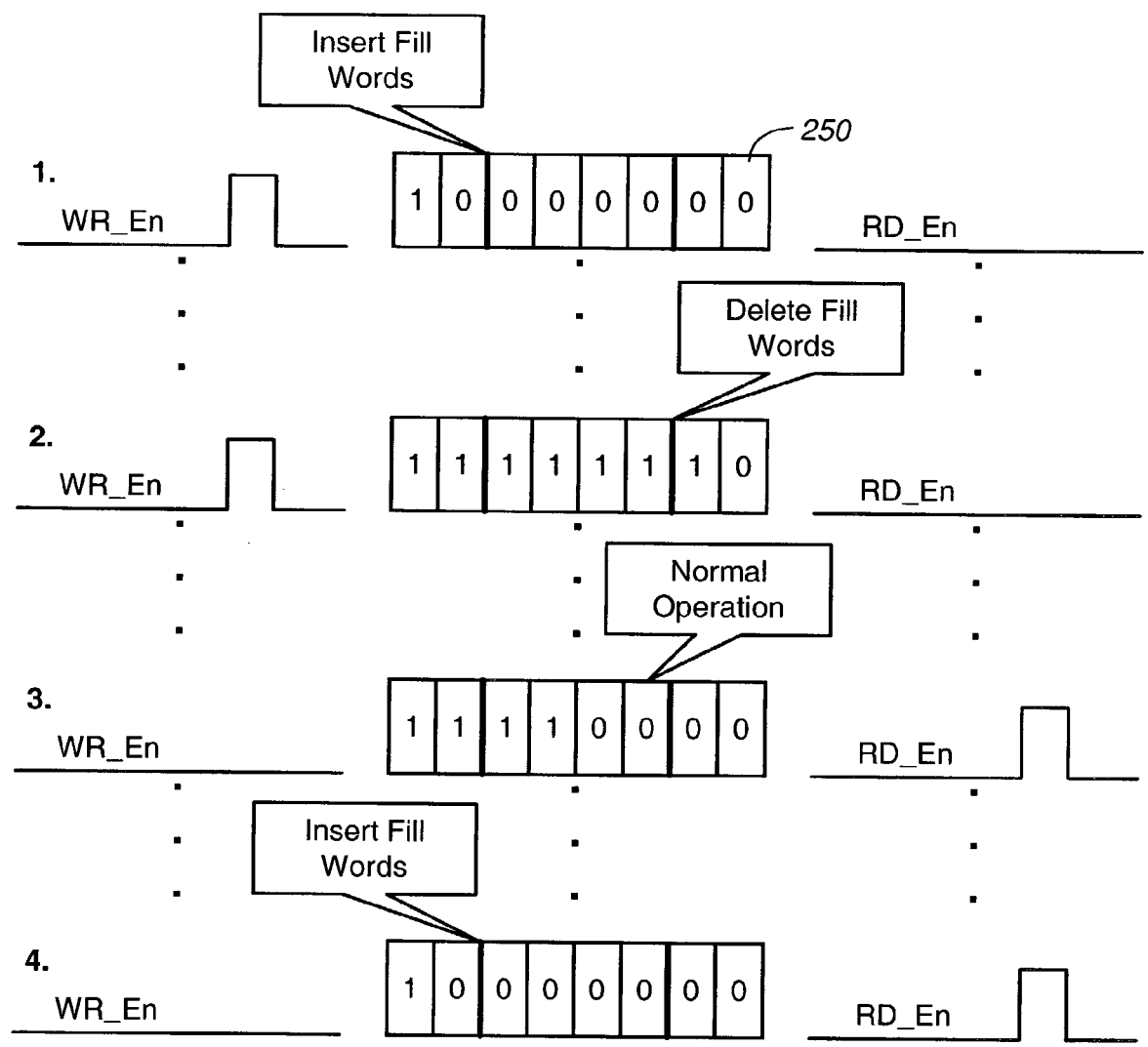
FIG._2A

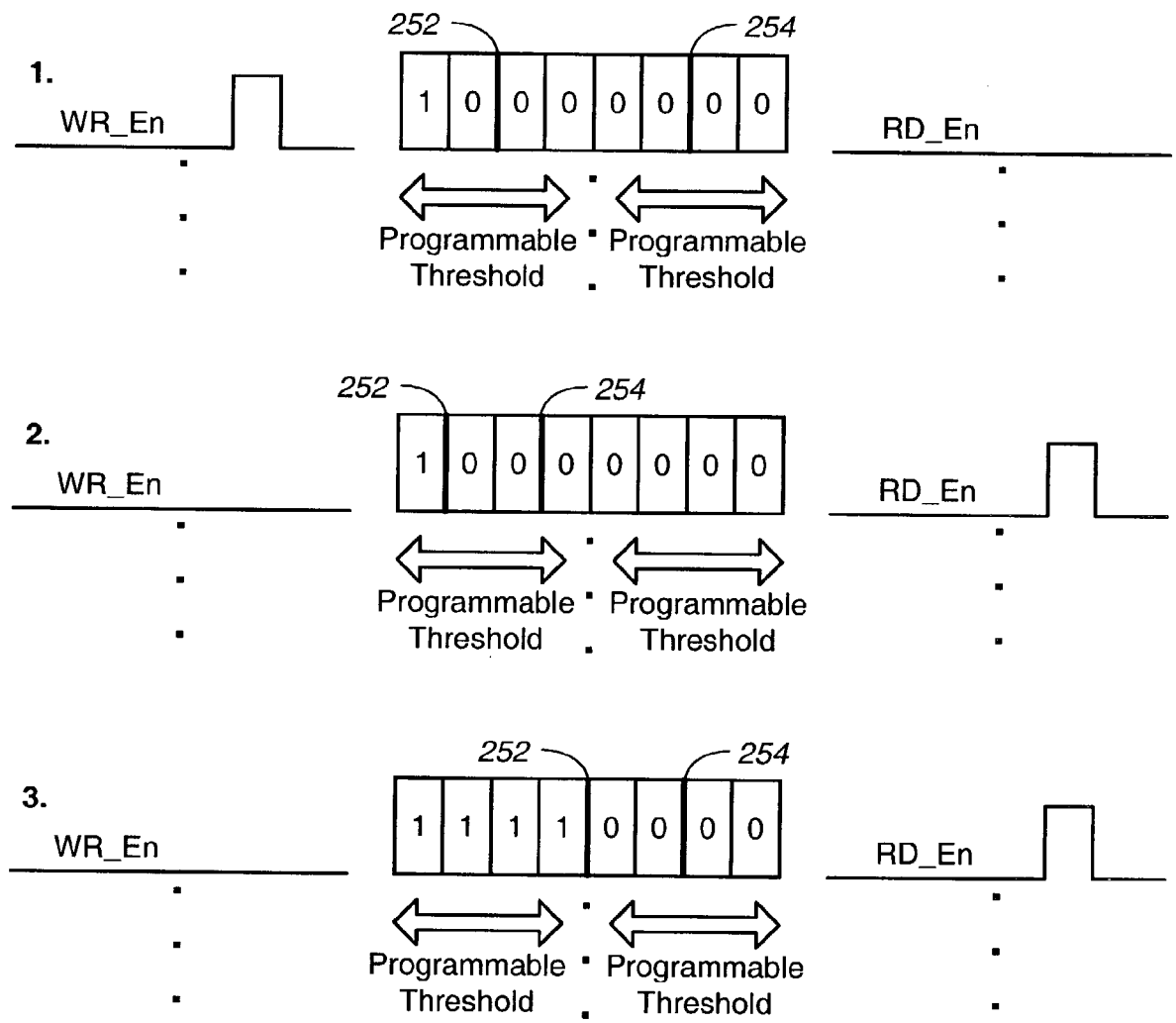
FIG._2B

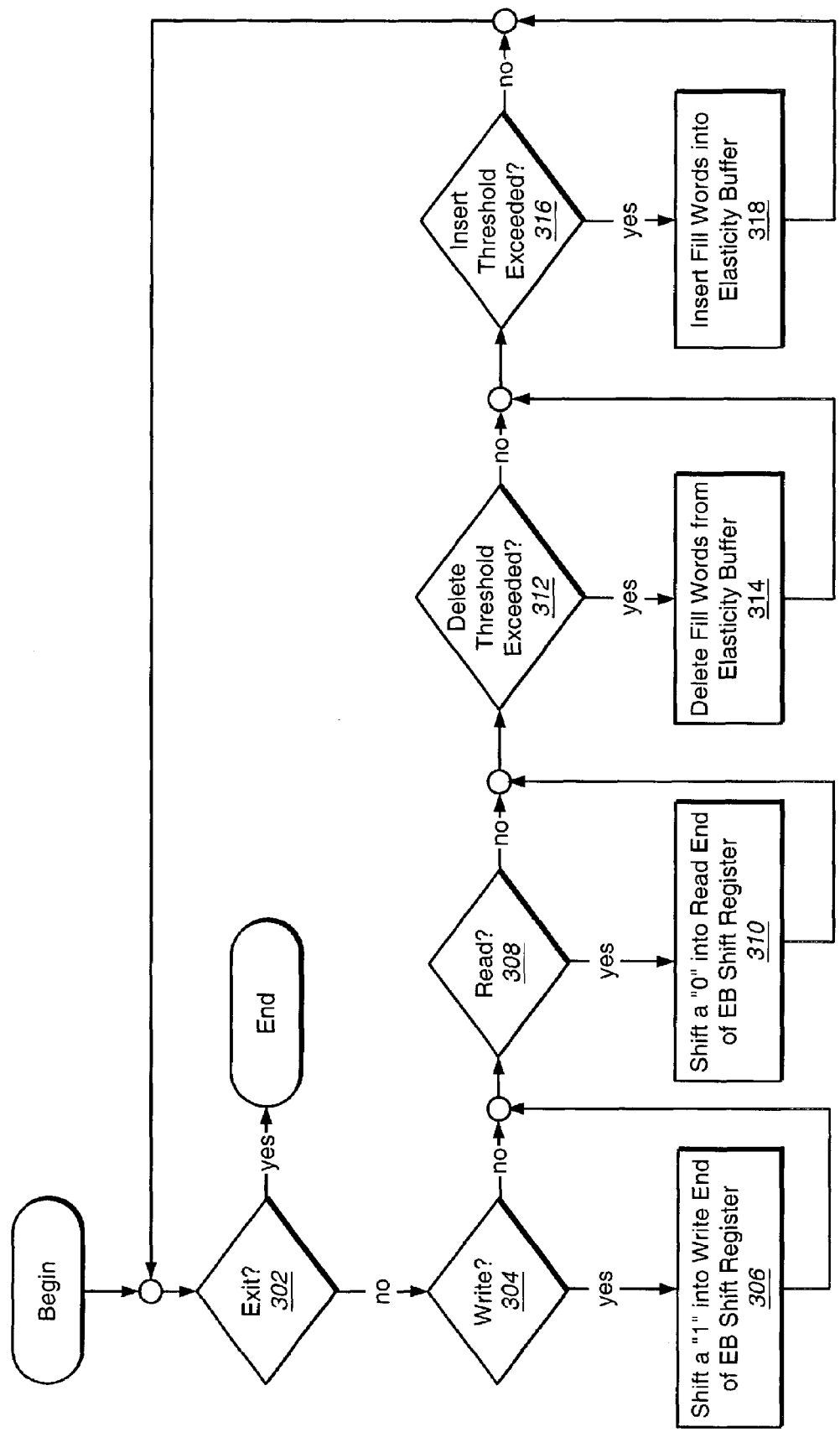
FIG._3

SHIFT REGISTER CONTROL OF A CIRCULAR ELASTICITY BUFFER

BACKGROUND OF THE INVENTION

1. Technical Field

The present invention relates to latched serial communications and, in particular, to circular elasticity buffers. Still more particularly, the present invention provides a method, apparatus, and program for shift control of circular elasticity buffers.

2. Description of the Related Art

The internal clock for a device is based on a phased lock loop (PLL) with its own clock generator. This is used when transmitting data onto the serial link. When receiving serial data, this data must be latched based on a clock derived from the received data itself. Although the input clock is normally a fixed rate, it can differ slightly from the internal clock due to accepted manufacturer tolerances. Over time, the differences in the clocks can cause data corruption.

Clock skew management is handled by an elasticity buffer. The elasticity buffer circuitry is required to absorb the differences in these clock frequencies by either deleting "clock skew" fill words to keep the elasticity buffer from overflowing, or by inserting these fill words into the data stream to keep the elasticity buffer from underflowing. Fill words are usually pre-defined word values known as primitives, for example in the Serial ATA and Serial Attached SCSI an ALIGN primitive is defined as a fill word, in Fibre Channel, an IDLE primitive is defined as a fill word. The management logic for the elasticity buffer usually involves complex math equations as well as possible latency issues caused by taking into account the differences with the elasticity read and elasticity write clock domains.

Most elasticity buffers are circular, meaning that they start inputting data at address 0 (zero) and then increment the write address pointer. Once the last address has been written to, the address pointer "rolls-over" back to address 0. The same is true with the read pointer. Now take into account that both pointers are running on separate clocks. The logic associated with determining if the elasticity buffer is filling up or emptying is usually determined by how many spaces are available to write data into. This involves some type of math function implemented in the logic to determine how full or how empty the elasticity buffer actually is. For example, the math function may be as follows:

space_available=write_pointer_address[3:0]
-read_pointer_address[ 3:0]

The disadvantage of using a math function, as above, is that much more logic is required to determine whether the address pointers have "rolled-over." Since the address pointers are operating on different clocks, in order to keep the address values from being in a meta-stable state, the address values must be synchronized from one clock domain to another. This causes additional logic and latency, which will force the designer to make the elasticity buffer larger to account for the worst case latency.

Therefore, it would be advantageous to provide an improved management logic for an elasticity buffer.

SUMMARY OF THE INVENTION

The present invention provides a shift register to monitor the difference between the read and write pulses to an elasticity buffer. The shift register essentially eliminates the need for any math functions in the elasticity buffer management logic. The shift register is as wide as the elasticity buffer is deep. In other words, for every word in the elasticity buffer, the shift register has a corresponding bit. Each time a word is written into the elasticity buffer, without a simultaneous read word occurring, a value of "1" is shifted from a first end into the shift register, indicating that a space has been taken in the elasticity buffer. For every word read out of the elasticity buffer, without a simultaneous write word occurring, a value of "0" (zero) is shifted from a second end of the shift register, indicating that one more space is now available. If a write word event occurs simultaneously with a read word event, the shift register retains its previous value. This would indicate that amount space within the elasticity buffer that can be written to or read from has not changed. The elasticity buffer management logic need only monitor the shift register value to determine whether the elasticity buffer is nearly empty or nearly full, and if fill words need to be inserted or deleted.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a block diagram of a serial communications controller in accordance with a preferred embodiment of the present invention;

FIGS. 2A and 2B are example shift register operations in accordance with a preferred embodiment of the present invention; and FIG. 3 is a flowchart illustrating the operation of an elasticity buffer shift register control logic in accordance with a preferred embodiment of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and, in particular, with reference to FIG. 1, a block diagram of a serial communications controller is shown in accordance with a preferred embodiment of the present invention. The serial communications controller has write control logic 102 and read control logic 106. The write control logic stores data in elasticity buffer 104, which may be a circular first-in first-out (FIFO) buffer, and the read control logic reads the data from the elasticity buffer.

Elasticity buffer 104 is circular, meaning that write control logic 102 starts inputting data at address 0 (zero) and then increments the write address pointer (WR_Prt). Once the last address has been written to, WR_Ptr rolls over back to address 0. Read control logic 106 starts reading data at address 0 and then increments the read address pointer (RD_Ptr). Once the last address has been read from, RD_Ptr rolls over back to address 0.

As shown in FIG. 1, the write control logic is in a write clock domain and the read control logic is in a read clock domain. Since the address pointers are operating on different clocks, in order to keep the address values from being in a meta-stable state when being monitored the other clock domain, the address values must be synchronized from one clock domain to another. This causes additional logic and latency, which will force the designer to make the elasticity buffer larger to account for the worst case latency.

In accordance with a preferred embodiment of the present invention, the serial communications controller includes elasticity buffer (EB) shift register control 150. When a write is performed, write control logic 102 generates a write enable signal (WR_En). Similarly, when a read is performed, read control logic 106 generates a read enable signal (RD_En). Synchronizer 108 synchronizes the WR_En signal from the write clock domain to the read clock domain to form a synchronized write enable signal (WR_En_Sync).

EB shift register control 150 receives the RD_En signal and the WR_En_Sync signal and monitors the amount of space in the buffer using shift register 152. The shift register is as wide [n:0] as the elasticity buffer is deep. In other words, for every word in the elasticity buffer, the shift register has a corresponding bit. Each time a word is written into the elasticity buffer, without a simultaneous read word occurring, a value of "1" is shifted from a first end into the shift register, indicating that a space has been taken in the elasticity buffer. For every word read out of the elasticity buffer, without a simultaneous write word occurring, a value of "0" (zero) is shifted from a second end of the shift register, indicating that one more space is available. If a write word event occurs simultaneously with a read word event, the shift register retains its previous value. This would indicate that amount space within the elasticity buffer that can be written to or read from has not changed.

The EB shift register logic need only monitor shift register value to determine whether the elasticity buffer is nearly empty or nearly full, and if fill words need to be inserted or deleted. EB shift register logic 150 issues a delete fill word signal (Delet_Fill_wrd s) to write control logic 102 if a word is to be deleted. Synchronizer 110 synchronizes the Delet_Fill_wrds signal from the read clock domain to the write clock domain to form synchronized delete fill words signal (Delet_Fill_wrds_Sync). The EB shift register logic issues an insert fill word signal (Insert_Fill_wrds) to read control logic 106 if a word is to be inserted.

Delete_fill_words s may be issued to read control logic and Insert_fill_words may be issued to write control logic. However, in a preferred embodiment of the present invention, a more efficient way of deleting a fill word is to not assert the WR_En signal when a fill word is detected on the RX_Data[31:0] bus. Thus, there is one less WR_En pulse, and this allows the read side to catch up. Also for inserting a fill word, the present invention prevents the RD_En from being issued, and just places a fill word on the RX_FIFO_Data[31:0] bus.

With reference now to FIGS. 2A and 2B, example shift register operations are shown in accordance with a preferred embodiment of the present invention. More particularly, FIG. 2A illustrates shift register values as words are written into and read out of the elasticity buffer. First (operation 1), a WR_En signal is received without a simultaneous RD_En signal and a value of "1" is shifted into the left side of shift register 250. If this is the first word written to the elasticity buffer, then the shift register will hold a binary value of "10000000."

An insert fill words threshold may exist in the shift register at a particular location. For example, as shown in FIG. 2A, an insert fill words threshold may exist after the second bit from the left. If the shift register is filled with zeros past the insert fill words threshold (from right to left), the logic may consider the insert fill words exceeded. In this example, the shift register, and thus the elasticity buffer, is mostly empty because the insert fill words threshold is exceeded. Other conventions may be used, however. For example, the insert fill words threshold may be considered to be exceeded if the shift register is filled with values of "1" past the threshold.

In a subsequent write operation (operation 2), a WR_En signal is received without a simultaneous RD_En signal and a value of "1" is shifted into the left side of the shift register. In this example, seven out of eight words of the elasticity buffer have data stored therein. In this case, the shift register will hold a binary value of "11111110." A delete fill words threshold may exist in the shift register at a particular location. For example, as shown in FIG. 2A, a delete fill words threshold may exist after the second bit from the right. If the shift register is filled with values of "1" past the delete fill words threshold (from left to right), the logic may consider the delete fill words exceeded. In this example, the shift register, and thus the elasticity buffer, is mostly full because the delete fill words threshold is exceeded. Other conventions may be used, however. For example, the delete fill words threshold may be considered to be exceeded if the shift register is filled with values of "0" past the threshold. As a result, the elasticity buffer management logic may issue a delete fill words signal.

As another example (operation 3), when a RD_En signal is received without a simultaneous WR_En signal, a value of "0" (zero) is shifted into the right side of the shift register. In this example, four out of eight words of the elasticity buffer have data stored therein. In this case, the shift register will hold a binary value of "11110000." Since neither the insert fill words threshold nor the delete fill words threshold is exceeded, the elasticity buffer is determined to be in normal operation.

Next (operation 4), a subsequent RD_En signal is received without a simultaneous WR_En signal and another zero is shifted into the right side of the shift register. In this example, one out of the eight words of the elasticity buffer has data stored therein and the shift register holds a binary value of "1000000." Again, the insert fill words threshold is exceeded. Therefore, the elasticity buffer management logic may issue an insert fill words signal.

Turning now to FIG. 2B, an example operation of a shift register with programmable thresholds is shown. First (operation 1), a WR_En signal is received without a simultaneous RD_En signal and a value of "1" is shifted into the left side of the shift register. If this is the first word written to the elasticity buffer, then the shift register will hold a binary value of "10000000." An insert fill words threshold is programmed to a location after the second bit from the left. A delete fill words threshold is programmed to a location after the second bit from the right. If the shift register is filled with zeros past the insert fill words threshold (from right to left), the logic may consider the insert fill words exceeded. In this example, the shift register, and thus the elasticity buffer, is mostly empty because the insert fill words threshold is exceeded.

In another example operation (operation 2), a RD_En signal is received without a simultaneous WR_En signal and a value of "0" is shifted into the right side of the shift register. In this example, one out of eight words of the elasticity buffer has data stored therein. In this case, the shift register will hold a binary value of "10000000." In this case, the insert fill words threshold is programmed to a location after the first bit from the left and a delete fill words threshold is programmed to a location after the fifth bit from the right. In this example operation, the insert fill words threshold is not exceeded. Therefore, the elasticity buffer is determined to be in normal operation.

As another example (operation 3), when a RD_En signal is received without a simultaneous WR_En signal, a value of "0" (zero) is shifted into the right side of the shift register. In this example, four out of eight words of the elasticity buffer have data stored therein. In this case, the shift register will hold a binary value of "11110000." In this example, the insert fill words threshold is programmed to a location after the fourth bit from the left and a delete fill words threshold is programmed to a location after the second bit from the right. Since neither the insert fill words threshold nor the delete fill words threshold is exceeded, the elasticity buffer is determined to be in normal operation.

In the examples shown in FIGS. 2A and 2B, the shift register is eight bits wide, which corresponds to an elasticity buffer eight words deep. However, the size of the elasticity buffer and the corresponding width of the shift register may vary depending upon the implementation. The placements of the insert fill words threshold and the delete fill words threshold, whether they are static or programmable, may also vary depending upon the implementation. Other modifications may be made to the shift register operation within the scope of the present invention. For example, a value of "1" may be shifted into the right end of the shift register in response to a write without a corresponding read and a value of "0" (zero) may be shifted into the left end of the shift register in response to a read without a corresponding write. Alternatively, a value of "0" (zero) may be used to indicate a write and a value of "1" may be used to indicate a read.

With reference to FIG. 3, a flowchart illustrating the operation of an elasticity buffer shift register control logic is shown in accordance with a preferred embodiment of the present invention. The process begins and a determination is made as to whether an exit condition exists (step 302). An exit condition may exist, for example, when the logic is powered down or is switched to an idle state. If an exit condition exists, the process ends.

If an exit condition does not exist in step 302, a determination is made as to whether a write is detected (step 304) without a simultaneous corresponding read. A write may be detected, for example, by monitoring for a write enable signal. If a write is detected and a read is not detected at that same time, the process shifts a value of "1" into a write end of an elasticity buffer shift register (step 306). After a shift in step 306 or if a write is not detected in step 304, a determination is made as to whether a read is detected (step 308). A read may be detected, for example, by monitoring for a read enable signal. If a read is detected without a simultaneous corresponding write, the process shifts a value of "0" into a read end of the elasticity buffer shift register (step 310). After a shift in step 310 or if a read is not detected in step 308, a determination is made as to whether an insert fill words threshold is exceeded (step 312) or a delete fill words threshold is exceeded (step 316), since a fill word cannot be deleted at the same time it is being inserted.

If the delete fill words threshold is exceeded in step 312, then the process deletes one or more fill words from the elasticity buffer (step 314). After deletion of a fill word in step 314 or if the delete fill words threshold is not exceeded in step 312, the process determines whether the insert threshold is exceeded in step 316. If the insert fill words threshold is exceeded, then the process inserts one or more fill words into the elasticity buffer (step 318) and returns to step 302 to determine whether an exit condition exists. If the insert fill words threshold is not exceeded in step 316, the process returns to step 302 to determine whether an exit condition exists.

Thus, the present invention solves the disadvantages of the prior art by providing a shift register to monitor the difference between the read and write pulses to an elasticity buffer. The shift register essentially eliminates the need for any math functions in the elasticity buffer management logic. The elasticity buffer management logic need only monitor the shift register value to determine whether the elasticity buffer is nearly empty or nearly full, and if fill words need to be inserted or deleted. The shift register control logic reduces the amount of logic required and, thus, reduces the resulting latency, which can result in a smaller elasticity buffer.

It is important to note that while the present invention has been described in the context of a fully functioning data processing system, those of ordinary skill in the art will appreciate that the processes of the present invention are capable of being distributed in a form of a computer readable medium of instructions and in a variety of forms. Further, the present invention applies equally regardless of the particular type of signal bearing media actually used to carry out the distribution. Examples of computer readable media include recordable-type media such a floppy disc, a hard disk drive, a RAM, a CD-ROM, a DVD-ROM, and transmission-type media such as digital and analog communications links, wired or wireless communications links using transmission forms such as, for example, radio frequency and light wave transmissions. The computer readable media may take the form coded formats that are decoded for actual use in a particular data processing system.

What is claimed is:

1. A method for monitoring an elasticity buffer, comprising:
   responsive to performing a write into an elasticity buffer, shifting a first value into a write end of a shift register, wherein the shift register is as wide as the elasticity buffer is deep;
   responsive to performing a read from the elasticity buffer, shifting a second value into a read end of the shift register; and
   monitoring the shift register to determine whether the elasticity buffer nearly empty or nearly full.

2. The method of claim 1, further comprising detecting a write by monitoring for a write enable signal.

3. The method of claim 1, further comprising detecting a read by monitoring for a read enable signal.

4. The method of claim 1, wherein the step of monitoring the shift register includes:
   determining whether an insert fill words threshold is exceeded; and
   responsive to the insert fill words threshold being exceeded, generating an insert fill words signal.

5. The method of claim 4, wherein the insert fill words threshold is programmable.

6. The method of claim 1, wherein the step of monitoring the shift register includes:

determining whether a delete fill words threshold is exceeded; and responsive to the delete fill words threshold being exceeded, generating a delete fill words signal.

7. The method of claim 6, wherein the delete fill words threshold is programmable.

8. The method of claim 1, wherein the first value is a binary value of one and the second value is a binary value of zero.

9. An elasticity buffer management apparatus, comprising:
   an elasticity buffer;
   a shift register, wherein the shift register is as wide as the elasticity buffer is deep;
   a write control logic, wherein the write control logic writes words into the elasticity buffer;
   a read control logic, wherein the read control logic reads words from the elasticity buffer;
   an elasticity buffer control logic, wherein the elasticity buffer control logic shifts a first value into a write end of the shift register responsive to detecting a write to the elasticity buffer and shifts a second value into a read end of the shift register responsive to performing a read from the elasticity buffer.

10. The apparatus of claim 9, wherein the elasticity buffer control logic detects a write by monitoring for a write enable signal.

11. The apparatus of claim 9, wherein the elasticity buffer control logic detects a read by monitoring for a read enable signal.

12. The apparatus of claim 9, wherein the elasticity buffer control logic determines whether an insert fill words threshold is exceeded; and, responsive to the insert fill words threshold being exceeded, generates an insert fill words signal.

13. The apparatus of claim 12, wherein the insert fill words threshold is programmable.

14. The apparatus of claim 9, wherein the elasticity buffer control logic determines whether a delete fill words threshold is exceeded; and, responsive to the delete fill words threshold being exceeded, generates a delete fill words signal.

15. The apparatus of claim 14, wherein the delete fill words threshold is programmable.

16. The apparatus of claim 9, wherein the first value is a binary value of one and the second value is a binary value of zero.

17. An apparatus for monitoring an elasticity buffer, comprising:
   first shifting means, responsive to performing a write into an elasticity buffer, for shifting a first value into a write end of a shift register, wherein the shift register is as wide as the elasticity buffer is deep;
   second shifting means, responsive to performing a read from the elasticity buffer, for shifting a second value into a read end of the shift register; and
   monitoring means for monitoring the shift register to determine whether the elasticity buffer nearly empty or nearly full.

18. The apparatus of claim 17, wherein the monitoring means includes:
   means for determining whether an insert fill words threshold is exceeded; and
   means, responsive to the insert fill words threshold being exceeded, for generating an insert fill words signal.

19. The apparatus of claim 17, wherein the monitoring means includes:
   means for determining whether a delete fill words threshold is exceeded; and
   means, responsive to the delete fill words threshold being exceeded, for generating a delete fill words signal.

20. A computer program product, in a computer readable medium, for monitoring an elasticity buffer, comprising:
   instructions, responsive to performing a write into an elasticity buffer, for shifting a first value into a write end of a shift register, wherein the shift register is as wide as the elasticity buffer is deep;
   instructions, responsive to performing a read from the elasticity buffer, for shifting a second value into a read end of the shift register; and
   instructions for monitoring the shift register to determine whether the elasticity buffer nearly empty or nearly full.

* * * * *